United States Patent
Akagawa et al.

(10) Patent No.: US 10,656,019 B2
(45) Date of Patent: May 19, 2020

(54) METHOD OF DETERMINING CHROMATICITY RANK OF LIGHT EMITTING DEVICE

(71) Applicant: NICHIA CORPORATION, Anan-shi (JP)

(72) Inventors: Seitaro Akagawa, Komatsushima (JP); Toshiyuki Hashimoto, Komatsushima (JP); Kentaro Nishigaki, Osaka (JP)

(73) Assignee: NICHIA CORPORATION, Anan-shi (JP)

( * ) Notice: Subject to any disclaimer, the term of this patent is extended or adjusted under 35 U.S.C. 154(b) by 177 days.

(21) Appl. No.: 15/655,960

(22) Filed: Jul. 21, 2017

(65) Prior Publication Data

US 2018/0024006 A1    Jan. 25, 2018

(30) Foreign Application Priority Data

Jul. 22, 2016  (JP) ................................ 2016-144007
Sep. 16, 2016  (JP) ................................ 2016-181099

(51) Int. Cl.
| | | |
|---|---|---|
| *G01J 3/52* | (2006.01) | |
| *G01J 3/50* | (2006.01) | |
| *H01L 27/15* | (2006.01) | |
| *B07C 5/342* | (2006.01) | |
| *H01L 25/075* | (2006.01) | |
| *H01L 33/50* | (2010.01) | |

(52) U.S. Cl.
CPC .............. *G01J 3/505* (2013.01); *B07C 5/342* (2013.01); *G01J 3/506* (2013.01); *H01L 25/0753* (2013.01); *H01L 27/15* (2013.01); *H01L 33/502* (2013.01)

(58) Field of Classification Search
CPC .................................. G01J 3/505; G01J 3/506
See application file for complete search history.

(56) References Cited

U.S. PATENT DOCUMENTS

| | | | |
|---|---|---|---|
| 2010/0090935 | A1 | 4/2010 | Tseng et al. |
| 2010/0128199 | A1 | 5/2010 | Kim et al. |

(Continued)

FOREIGN PATENT DOCUMENTS

| | | |
|---|---|---|
| JP | 2002-298627 | 10/2002 |
| JP | 2010-093237 | 4/2010 |

(Continued)

*Primary Examiner* — Daniel Whalen
*Assistant Examiner* — Suberr L Chi
(74) *Attorney, Agent, or Firm* — Mori & Ward, LLP

(57) ABSTRACT

A method of determining a chromaticity rank of a light emitting device includes selecting the light emitting device having a chromaticity rank in a region surrounded by four defining points on a 1931 CIE Chromaticity Diagram. A ratio of a distance in a y-direction between, of the four defining points, two defining points furthest from each other in the y-direction to a distance in an x-direction between, of the four defining points, two defining points furthest from each other in the x-direction is 0.5 or less A peak light emission wavelength of the blue light emitting element is in a range of 447 to 452 nm, a peak light emission wavelength of the green light emitting element is in a range of 520 to 541 nm, and a peak light emission wavelength of the red light emitting element is in a range of 630 to 632 nm.

13 Claims, 5 Drawing Sheets

(56) References Cited

U.S. PATENT DOCUMENTS

| | | | |
|---|---|---|---|
| 2011/0037080 A1* | 2/2011 | Emerson | H01L 25/0753 |
| | | | 257/88 |
| 2012/0038280 A1 | 2/2012 | Zoorob et al. | |
| 2012/0320309 A1* | 12/2012 | Hineno | G02F 1/133603 |
| | | | 349/64 |
| 2014/0246990 A1 | 9/2014 | Kim et al. | |
| 2015/0019168 A1 | 1/2015 | Ohta et al. | |
| 2017/0146856 A1 | 5/2017 | Yokota | |
| 2017/0229512 A1* | 8/2017 | Akagawa | G02B 6/0073 |

FOREIGN PATENT DOCUMENTS

| | | |
|---|---|---|
| JP | 2012-509590 | 4/2012 |
| JP | 2013-504876 | 2/2013 |
| JP | 2013-179254 | 9/2013 |
| JP | 2014-215562 | 11/2014 |
| JP | 2014-531709 | 11/2014 |
| JP | 2015-194637 | 11/2015 |
| WO | WO 2011/031635 | 3/2011 |
| WO | WO 2013/114642 | 8/2013 |

* cited by examiner

METHOD OF DETERMINING CHROMATICITY RANK OF LIGHT EMITTING DEVICE

CROSS-REFERENCE TO RELATED APPLICATIONS

The present application claims priority under 35 U.S.C. § 119 to Japanese Patent Application No. 2016-144007 filed on Jul. 22, 2016, entitled "METHOD OF DETERMINING CHROMATICITY RANK OF LIGHT EMITTING DEVICE", and Japanese Patent Application No. 2016-181099 filed on Sep. 16, 2016, entitled "METHOD OF DETERMINING CHROMATICITY RANK OF LIGHT EMITTING DEVICE". The contents of these applications are incorporated herein by reference in their entirety.

BACKGROUND

1. Technical Field

The present invention relates to a method of determining a chromaticity rank of a light emitting device.

2. Description of Related Art

Light emitting diodes (LED) have come into use for a light source of a backlight device for a liquid crystal display device. Backlight devices using LEDs have advantages such as a long operation life, low power consumption, a good response speed and easy reduction in thickness, and are thus widespread.

For a light source of a backlight device using an LED as described above, for example, white LEDs each including a blue LED die and a wavelength conversion member (fluorescent material), which absorbs blue light from the blue LED die and converts the wavelength of the light into a different wavelength, is used. In the liquid crystal display device, a color filter of red, green, and blue (RGB) is arranged at a liquid crystal side, and light from the white LEDs is allowed to be emitted through the color filters, so that the liquid crystal display device can display a color image.

It is known that chromaticity of white LEDs are varied according to variance in an emission wavelength of a blue LED die used in each of the white LEDs and an amount, composition, and the like of a fluorescent material used in each of the white LEDs. Accordingly, white LEDs are ranked according to chromaticity on a 1931 CIE Chromaticity Diagram, and white LEDs with an emission color in a desired chromaticity rank are used for a light source of a backlight device (JP 2013-504876 A).

SUMMARY

However, even white LEDs of the same chromaticity rank may have light emission spectra different from each other, and thus light emitted from such white LEDs and passes through a color filter may be varied in chromaticity. As one example, a case is described below in which four blue LED dice with a peak wavelength of 440 nm, 445 nm, 450 nm and 455 nm, respectively, are each combined with a fluorescent material that is adapted to emit yellow fluorescent light upon excitation by respective blue LED die to obtain four white LEDs. On a chromaticity diagram shown in FIG. 1, chromaticity points obtained from four spectra each corresponding to respective one of the four white LEDs are overlapped on substantially one point of $(x, y)=(0.281, 0.246)$ shown on the lower left side of FIG. 1. In FIG. 1, it is appeared that a symbol ■ is located at $(x, y)=(0.281, 0.246)$, but at this chromaticity coordinate, four chromaticity points that correspond to the peak wavelengths of 440 nm, 445 nm, 450 nm and 455 nm, respectively, are present. Further, on the chromaticity diagram shown in FIG. 1, four chromaticity points each obtained from the spectrum of light from respective one of the white LEDs that has passed through a color filter are presented at chromaticity points that are greatly different from each other, as shown on the upper light side of the chromaticity diagram shown in FIG. 1. Thus, the chromaticity of light that has passed through a color filter may be out of a predetermined range of chromaticity.

According to certain embodiments of the present disclosure, a method of determining a chromaticity rank of a light emitting device is provided so that the chromaticity of a color display on a liquid crystal display board is in a predetermined chromaticity range.

An embodiment of the present disclosure includes a method of determining a chromaticity rank of a light emitting device having a chromaticity so that a color display on a liquid crystal display board, for which the light emitting device is used, has a chromaticity in a predetermined chromaticity range. The method includes measuring a chromaticity of a light emitting device including a blue light emitting element, a green light emitting element, and a red light emitting element or a red fluorescent member; and selecting the light emitting device for use in a color display on a liquid crystal display board when the light emitting device has a chromaticity rank in a region surrounded by four defining points on a 1931 CIE Chromaticity Diagram. A ratio of a distance in a y-direction between, of the four defining points, two defining points furthest from each other in the y-direction to a distance in an x-direction between, of the four defining points, two defining points furthest from each other in the x-direction is 0.5 or less. A peak light emission wavelength of the blue light emitting element is in a range of 447 to 452 nm, a peak light emission wavelength of the green light emitting element is in a range of 520 to 541 nm, and a peak light emission wavelength of the red light emitting element or the red fluorescent member is in a range of 630 to 632 nm.

With certain embodiments of the present disclosure, a method of determining a chromaticity rank of a light emitting device can be provided that allows a color display on a liquid crystal display board to be in a predetermined chromaticity range.

DESCRIPTION OF EMBODIMENT(S)

Figure 1:
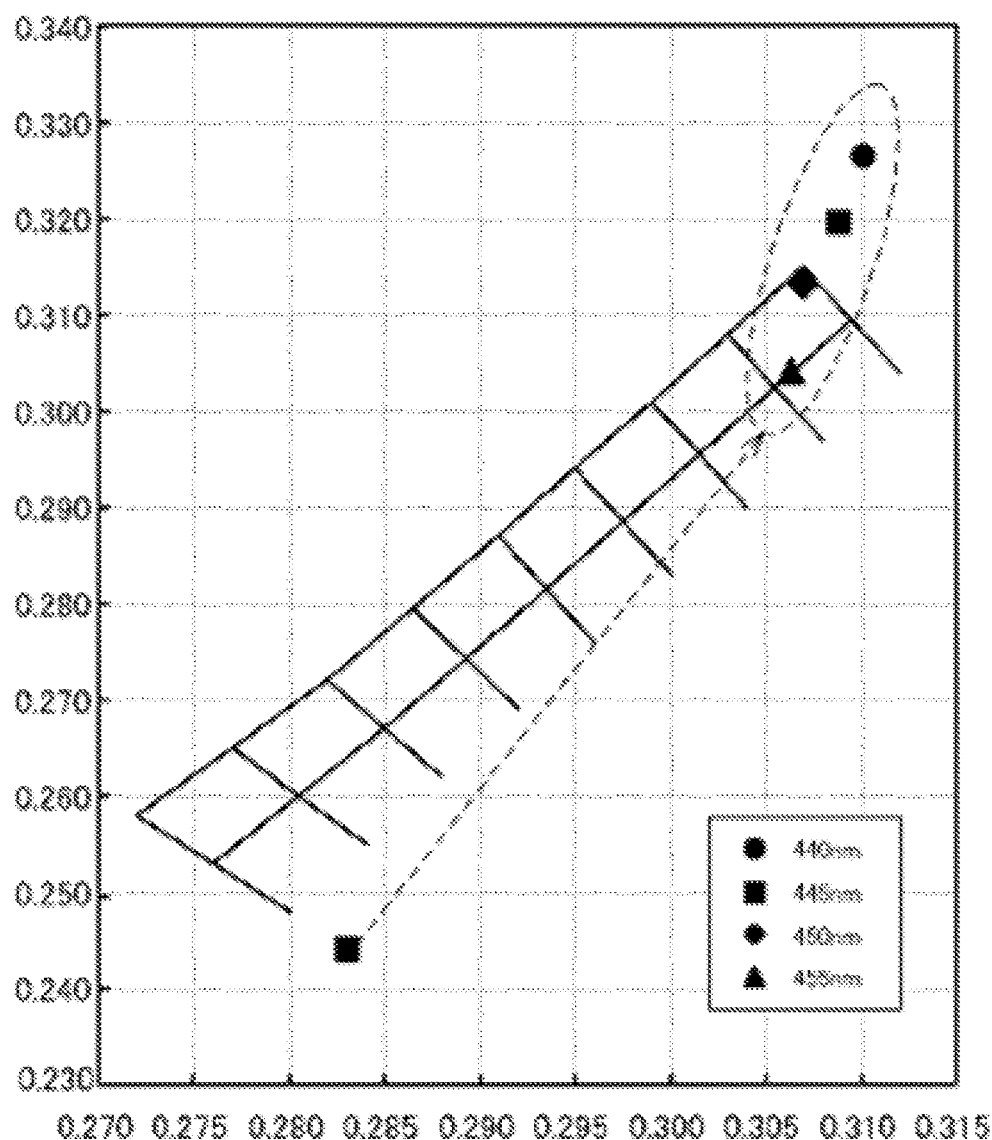
FIG. 1 is a diagram showing a shift between the chromaticity of a white LED and the chromaticity after passage through a color filter in a related liquid crystal display device.

Certain embodiments of the present disclosure will be described below with reference to the drawings. It is noted that the embodiments described below are intended to implement the technical concept of the present disclosure, and are not intended to limit the technical scope of the present disclosure. The sizes, positional relationships, etc., of members shown in the drawings may be exaggerated for ease of explanations. Parts with the same numerals in a plurality of drawings indicates the same part or member. A relationship between a color name and a chromaticity coordinate, a relationship between a wavelength range and a color name of monochromatic light, etc., is based on JIS Z8110.

Figure 2:
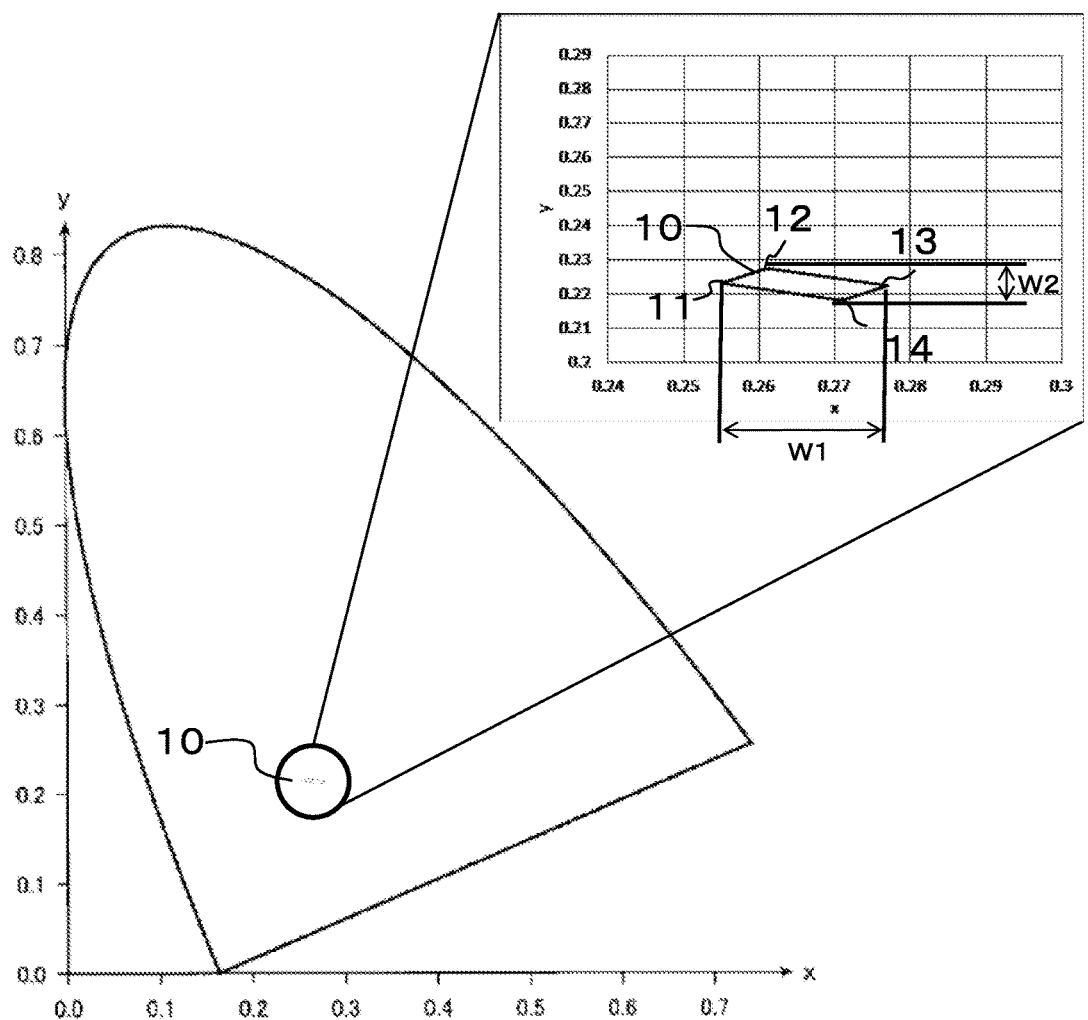
FIG. 2 is a diagram showing a chromaticity rank for classifying a light emitting device according to one embodiment of the present disclosure.

FIG. 2 is a diagram showing a chromaticity rank 10 in the present disclosure on a 1931 CIE Chromaticity Diagram. The chromaticity of a light emitting device 100 that is used for a light source of a backlight unit for a liquid crystal display is at the chromaticity rank 10. As shown in FIG. 2, a region showing the chromaticity rank 10 is surrounded by defining points of a first point 11, a second point 12, a third point 13 and a fourth point 14. In the chromaticity rank 10 shown in FIG. 2, for example, the x and y coordinates of the first point 11 are 0.255 and 0.2227, respectively, the x and y coordinates of the second point 12 are 0.2607 and 0.2273, respectively, the x and y coordinates of the third point 13 are 0.277 and 0.2233, respectively, and the x and y coordinates of the fourth point 14 are 0.2713 and 0.2187, respectively. The x and y coordinates of the first point 11 to fourth point 14 may be appropriately selected, and are selected by the wavelength of a light emitting element to be used, the type of a fluorescent material and so on.

The ratio of a distance W2 in a y-direction between, among the first point 11 to fourth point 14, two points furthest from each other in the y-direction to a distance W1 in an x-direction between, among the first point 11 to fourth point 14, two points furthest from each other in the x-direction is 0.5 or less. The ratio of the width W2 to the width W1 is preferably 0.4 or less. Accordingly, the region of the chromaticity rank 10 has a shape longer in the x-direction than in the y-direction. In the case where a region of a chromaticity rank has a shape that elongates in the y-direction than in the x-direction, the chromaticities of light from a plurality of light emitting devices that has passed through a color filter in the chromaticity rank is greatly varied in the y-direction. If chromaticities of light that have passed through a color filter is greatly varied in the y-direction, an operation of adjusting a green color filter to control a luminance is required. In particular, in the case where light that has passed through a color filter has a high y value, the luminance is controlled by reducing the transmittance of the green color filter, so that, even if a light emitting device of a high luminance is used, a light emitting device may not sufficiently exhibit the performance of the light emitting device. On the other hand, when a region of a chromaticity rank has a shape that is shorter in the y-direction (i.e., shape that elongates in the x-direction) as in the chromaticity rank 10 in the present disclosure, a variation in chromaticities of light that has passed through a color filter in the y-direction can be reduced, and thus an operation of adjusting the color filter, etc., is not needed. In the chromaticity rank 10 shown in FIG. 2, the first point 11 and the third point 13 are furthest from each other in the x-direction, with the distance W1 of 0.022, the second point 12 and the fourth point 14 are furthest from each other in the y-direction, with the distance W2 of 0.0086, and the ratio of the width W2 to the width W1 is 0.39.

Figure 3:
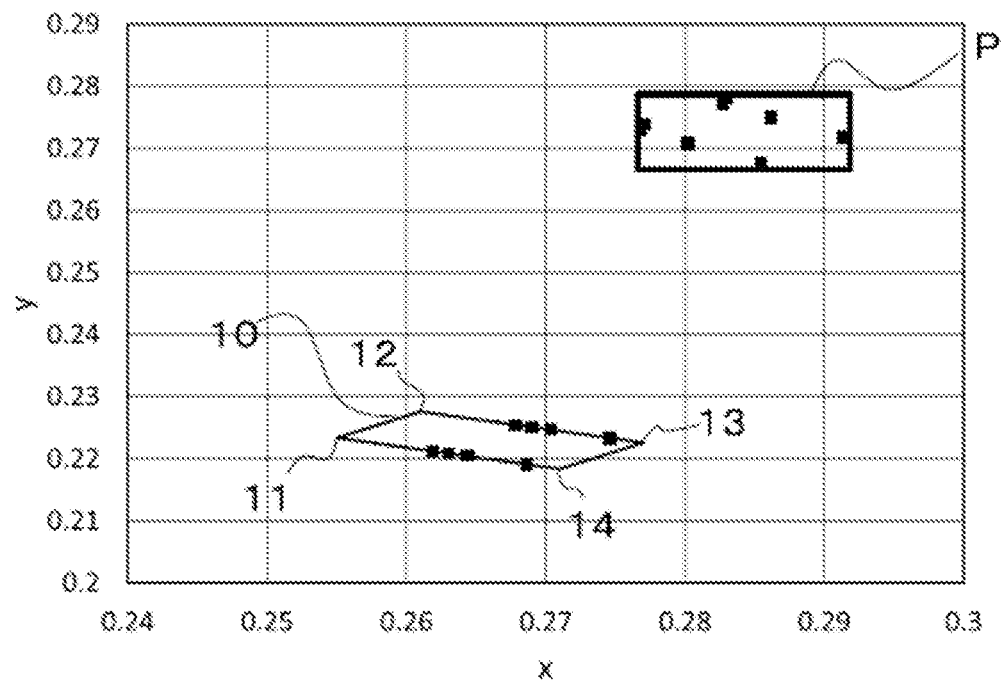
FIG. 3 is a diagram showing a chromaticity rank for classifying a light emitting device according to one embodiment of the present disclosure.

Next, FIG. 3 shows chromaticity coordinates of light from the light emitting device 100 that has passed through a color filter in the chromaticity rank 10 shown in FIG. 2. As shown in FIG. 3, the distribution P of chromaticity coordinates of light that have passed through a color filter extends in the x-direction, and the variation of the chromaticity coordinates in the y-direction is reduced compared with the variation in the x-direction. In FIG. 3, the variation in chromaticity coordinates of light that has passed through a color filter is 0.0106.

The variation in the y-direction in chromaticity coordinates of light that has passed through a color filter is preferably 0.015 or less on the 1931 CIE Chromaticity Diagram. With the variation in the y-direction in chromaticity coordinates after passing through a color filter in this range, such light can be recognized by human eye to have a uniform luminance, and thus an operation of controlling the luminance of a color filter is not required.

The light emitting device 100 that can have chromaticity in the chromaticity rank 10 in the present disclosure with a high yield will be described.

The light emitting device 100 includes a blue light emitting element 1, a green light emitting element 2, and a red light emitting element 3 or a red fluorescent member 4. A peak light emission wavelength of the blue light emitting element 1 is in a range of 447 to 452 nm, a peak light emission wavelength of the green light emitting element 2 is in a range of 520 to 541 nm, and a peak light emission wavelength in the red light emitting element 3 or the red fluorescent member 4 is in a range of 630 to 632 nm. In another embodiment, in the case where the red light emitting element 3 is used, a red light emitting element with the peak emission wavelength in a range selected between 630 and 660 nm such that a difference between the maximum of the range and the minimum of the range is 5 nm or smaller can be used. For example, a red light emitting element with a light emission peak wavelength in a range of 655 to 660 nm can be used for the red light emitting element 3. With such a red light emitting element 3, the light emitting device 100 having good color reproducibility can be provided.

For the green light emitting element 2, a light emitting element with a half-value width of 40 nm or less is preferably used in accordance with the transmission spectrum of a color filter, more preferably a light emitting element with a half-value width of 30 nm or less is used. The backlight unit for a liquid crystal display using such a green light emitting element 2 can increase the purity of the green component, so that high color reproducibility can be achieved.

Figure 4A:
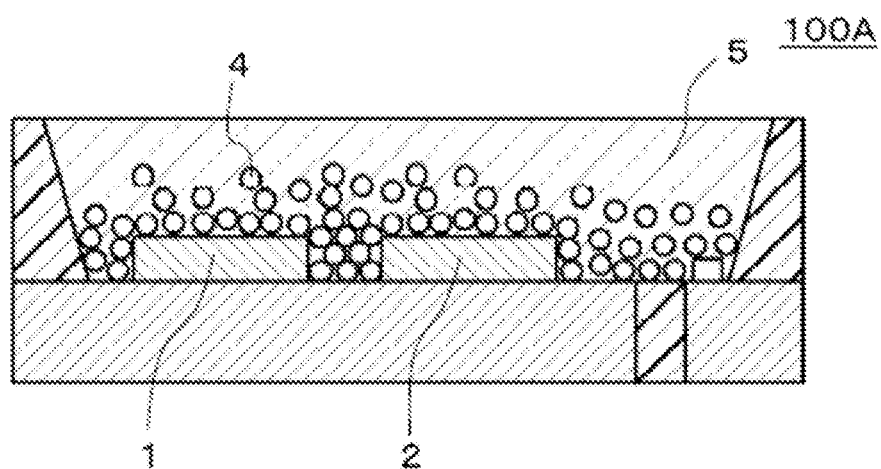
FIG. 4A is a schematic cross-sectional view showing a light emitting device 100A according to one embodiment of the present disclosure.

FIG. 4A shows a light emitting device 100A including the blue light emitting element 1, the green light emitting element 2 and the red fluorescent member 4. In FIG. 4A, a light-transmissive member 5 containing the red fluorescent member 4 covers the blue light emitting element 1 and the green light emitting element 2. The light-transmissive member 5 is disposed such that at least a portion of the light-transmissive member 5 is located between the blue light emitting element 1 and the green light emitting element 2. In the case where a red fluorescent material that is hardly excited by the green light emitting element 2 is used for the red fluorescent member 4, the content density (distribution density) of the red fluorescent member 4 near the blue light emitting element 1 may be larger than the content density of the red fluorescent member 4 near the green light emitting element 2. With this arrangement, the ratio of light emitted from the green light emitting element 2 that is shielded by the red fluorescent member 4 is reduced, so that light is efficiently extracted. The content of the red fluorescent member 4 in the light-transmissive member 5 is preferably in a range of 30 to 80% by weight. In the case where a red fluorescent material that is efficiently excited by an ultraviolet light emitting element is used for the red fluorescent member 4, the light emitting device 100A may further include an ultraviolet light emitting element.

Figure 4B:
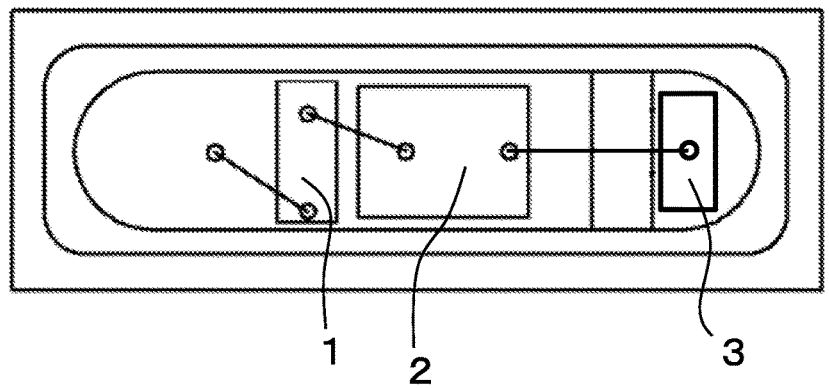
FIG. 4B is a schematic cross-sectional view showing a light emitting device 100B according to one embodiment of the present disclosure.

FIG. 4B shows a light emitting device 100B including the blue light emitting element 1, the green light emitting element 2 and the red light emitting element 3. The blue light emitting element 1, the green light emitting element 2 and the red light emitting element 3 are electrically connected in series.

Figure 4C:
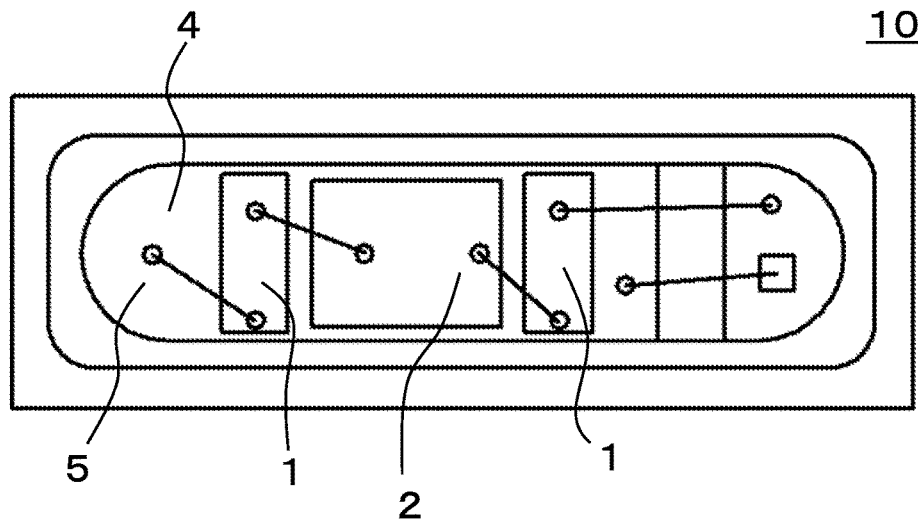
FIG. 4C is a schematic cross-sectional view showing a light emitting device 100C according to one embodiment of the present disclosure.

A light emitting device 100C shown in FIG. 4C includes two blue light emitting elements 1, the green light emitting element 2 and the red fluorescent member 4. The two blue light emitting elements 1 and the green light emitting element 2 are electrically connected in series. In the light emitting device 100C, two light emitting elements that are configured to emit light of the same color and a light emitting element disposed between the two light emitting elements and configured to emit light of a color different from the color of the light that is configured to be emitted from the two light emitting elements are disposed. In FIG. 4C, the green light emitting element 2 is disposed between two blue light emitting elements 1. With this arrangement, good color mixing of light emitted from the light emitting elements and light emitted from the fluorescent material that has been excited by the light emitted from the light emitting elements can be attained, so that color unevenness of the light emitting device can be largely reduced.

The ratio of the optical output of the green light emitting element 2 to the optical output of the blue light emitting element 1 is preferably in a range of 0.3 to 0.7. With this ratio, good color reproducibility can be obtained. The optical output of the blue light emitting element 1 may be equal to the optical output of the green light emitting element 2.

The "optical output" in the present specification refers to a radiant flux in JIS Z 8113. The ratio of the optical outputs of light emitting elements can be determined by measuring light emission spectra of the light emitting elements using a spectrophotometer and calculating the ratio of the integrated value of light emission spectra of the blue light emitting element and integrated value of light emission spectra of the green light emitting element. The optical output of a light emitting element is determined according to the peak light emission peak wavelength of the light emitting element, the planar area of the light emitting element, the type of a semiconductor layered body in the light emitting element, or the like.

In a related method, the blue light emitting element 1 and the green light emitting element 2 are selected according to the peak light emission peak wavelength, and each of the blue light emitting element 1, the green light emitting element 2 and the red fluorescent member 4 is then selected from those in a wide wavelength range of respective color, for obtaining a light emitting device with a desired chromaticity. With this manner, however, light emitting devices having the same chromaticity but having different light emission spectra may be obtained. Accordingly, light emitted from such light emitting devices with the same chromaticity may have varied chromaticity after passing through a color filter. In particular, in the case where blue light emitting elements with variance in peak light emission peak wavelength of 10 nm or more are used, ratio of blue light transmitted through a color filter may be greatly varied, so that the amount of shift in chromaticity of light after passing through a color filter may be increased.

In view of the above, in the light emitting device 100 according to the present disclosure, the peak light emission wavelength of the blue light emitting element 1 and the peak light emission wavelength of the red light emitting element 3 or the red fluorescent member 4 are each in a narrow range, and the blue light emitting element 1 and the red light emitting element 3 are combined with the green light emitting element 2 having a light emission peak wavelength in a range wider than that of each of the blue light emitting element 1 and the red light emitting element 3. More specifically, in the case where a light emitting element with a peak light emission wavelength of 520 to 541 nm is used for the green light emitting element 2 and a light emitting element with a light emission peak wavelength of 447 to 452 nm is used for the blue light emitting element 1, for the red light emitting element 3 or the red fluorescent member 4, the red light emitting element 3 or the red fluorescent member 4 with a peak light emission wavelength of 630 to 632 nm is used. With this arrangement, the chromaticity of light after passing through a color filter can be in a predetermined range as shown in FIG. 3.

Figure 5:
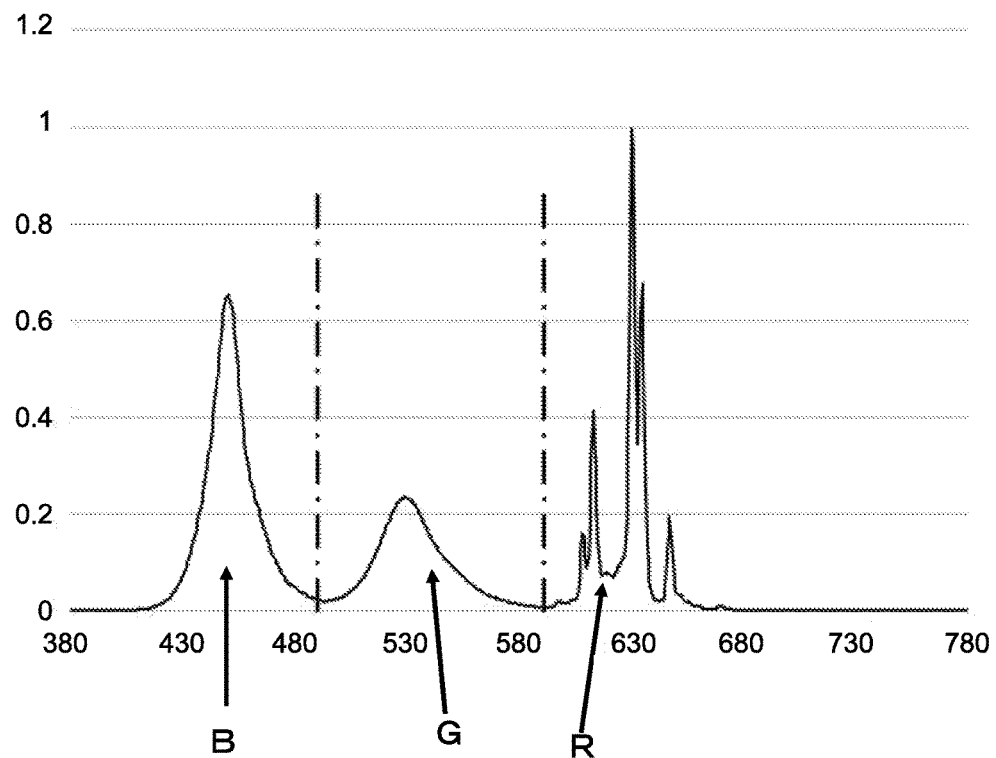
FIG. 5 is a diagram showing a light emission spectrum of a light emitting device according to one embodiment of the present disclosure.

The chromaticity of the light emitting device 100 is determined according to a ratio of the area of a blue component region B, the area of a green component region G and the area of a red component region R in a region defined by the light emission spectrum of the light emitting device 100 and the x axis. In other words, even if the light emission peak wavelengths of the blue component, the green component and the red component are the same, change in the optical outputs of the light emitting elements allows the balance between the colors to be changed, which allows the chromaticity of white color to be changed. With the light emitting device 100, adjustment of the area of the green component region G in the light emission spectrum allows the chromaticity of white color to be changed in the x-direction while the amount of shift in the y-direction is reduced, so that the chromaticity of white light can be in the chromaticity rank 10, which extends in the x-direction. Examples of a method of adjusting the area of the green component region G includes adjusting the optical output of the green light emitting element 2. With this manner, the green light emitting element 2, which is varied in optical output, can be used, and therefore the yield of the green light emitting element 2 can be improved. FIG. 5 is a diagram showing a light emission spectrum of the light emitting device 100, in which, as one example, a range of less than 490 nm is referred to as the blue component region B, a range of not less than 490 nm and less than 570 nm is referred to as the green component region G, and a range of not less than 570 nm is referred to as the red component region R. Such divisions of respective regions may be appropriately provided. It is preferable that the area of the blue component region B is 100, and the area of the red component region R is in a range of 60 to 80, the area of the green component region G is in a range of 55 to 70.

Each of the blue light emitting element 1, the green light emitting element 2 and the red light emitting element 3 may be a semiconductor element such as a light emitting diode (LED). For a semiconductor used in each of the blue light emitting element 1, the green light emitting element 2 and the red light emitting element 3, a nitride-based semiconductor ($In_XAl_YGa_{1-X-Y}N$, $0 \leq X$, $0 \leq Y$, $X+Y \leq 1$) or the like can be used. Each of the blue light emitting element 1, the green light emitting element 2 and the red light emitting element 3 may have a square shape, a rectangular shape, a triangular shape, or a hexagonal shape in a plan view. The light emitting device may include a plurality of blue light emitting elements 1, green light emitting elements 2 and red light emitting elements 3.

It is preferable that a fluorescent material adapted to be excited by light emitted from the blue light emitting element 1 is selected for the red fluorescent member 4, and that the red fluorescent member 4 hardly absorbs green light from the green light emitting element 2 to emit red light. In other words, it is preferred that the red florescent material 4 does not substantially convert green light into red light. The reflectance of the red fluorescent member 4 with respect to green light is preferably 70% or more on average in a wavelength range of green light. With use of a fluorescent material having a high reflectance with respect to green light, i.e. a fluorescent material that hardly absorbs green light, i.e. a fluorescent material that hardly converts the wavelength of green light, for the red fluorescent member 4, designing of the light emitting device can be facilitated.

In the case of using a red fluorescent material that greatly absorbs green light, balance of output light from the light emitting device must be examined in view of wavelength conversion by the red fluorescent member 4 not only with respect to light from the blue light emitting element 1 but also light from the green light emitting element 2. Meanwhile, using the red fluorescent member 4 that hardly converts the wavelength of green light allows balance of output from the light emitting device to be designed in view of only wavelength conversion of blue light emitted by the blue light emitting element 1.

Examples of the above-described preferred red fluorescent member 4 may include the fluorescent materials in the below. For the red fluorescent member 4, at least one of these fluorescent materials can be used.

A first type of red fluorescent material is a red fluorescent material having a composition represented by the following general formula (I).

$$A_2MF_6:Mn^{4+} \quad (I)$$

In the general formula (I), A represents at least one selected from the group consisting of K, Li, Na, Rb, Cs and $NH^{4+}$, and M represents at least one element selected from the group consisting of Group 4 elements and Group 14 elements.

The Group 4 elements include titanium (Ti), zirconium (Zr) and hafnium (Hf). The Group 14 elements include silicon (Si), germanium (Ge), tin (Sn) and lead (Pb).

Specific examples of the first type of red fluorescent material may include $K_2SiF_6:Mn^{4+}$, $K_2(Si, Ge)F_6:Mn^{4+}$ and $K_2TiF_6:Mn^{4+}$.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A method of determining a chromaticity rank of a light emitting device having a chromaticity so that a color display on a liquid crystal display board, for which the light emitting device is used, has a chromaticity in a predetermined chromaticity range, the method comprising:
    measuring a chromaticity of a light emitting device including a blue light emitting element, a green light emitting element, and a red light emitting element or a red fluorescent member; and
    selecting the light emitting device, based on the measured chromaticity, for use in a color display on a liquid crystal display board when the light emitting device has a chromaticity rank in a region surrounded by four defining points on a 1931 CIE Chromaticity Diagram, wherein a ratio of a distance in a y-direction between, of the four defining points, two defining points furthest from each other in the y-direction to a distance in an x-direction between, of the four defining points, two defining points furthest from each other in the x-direction is 0.5 or less,
    wherein a peak light emission wavelength of the blue light emitting element is in a range of 447 to 452 nm, a peak light emission wavelength of the green light emitting element is in a range of 520 to 541 nm, and a peak light emission wavelength of the red light emitting element or the red fluorescent member is in a range of 630 to 632 nm, and
    wherein the distance in the y-direction between, of the four defining points, the two defining points furthest from each other in the y-direction on the 1931 CIE Chromaticity Diagram is in a range of 0.01 to 0.015.

2. The method of determining a chromaticity rank of a light emitting device according to claim 1,
    wherein the four defining points in the region of the chromaticity rank include a first defining point, a second defining point, a third defining point, and a fourth defining point, and
    wherein the x and y coordinates of the first defining point are 0.255 and 0.2227, respectively, the x and y coordinates of the second defining point are 0.2607 and 0.2273, respectively, the x and y coordinates of the third defining point are 0.277 and 0.2233, respectively, and the x and y coordinates of the fourth defining point are 0.2713 and 0.2187, respectively.

3. The method of determining a chromaticity rank of a light emitting device according to claim 1, wherein a ratio of an optical output of the green light emitting element to an optical output of the blue light emitting element is in a range of 0.3 to 0.7.

4. A method of determining a chromaticity rank of a light emitting device having a chromaticity so that a color display on a liquid crystal display board, for which the light emitting device is used, has a chromaticity in a predetermined chromaticity range, the method comprising:
    measuring a chromaticity of a light emitting device including a blue light emitting element, a green light emitting element, and a red light emitting element or a red fluorescent member; and
    selecting the light emitting device, based on the measured chromaticity, for use in a color display on a liquid crystal display board when the light emitting device has a chromaticity rank in a region surrounded by four defining points on a 1931 CIE Chromaticity Diagram, wherein a ratio of a distance in a y-direction between, of the four defining points, two defining points furthest from each other in the y-direction to a distance in an x-direction between, of the four defining points, two defining points furthest from each other in the x-direction is 0.5 or less, wherein a peak light emission wavelength of the blue light emitting element is in a range of 447 to 452 nm, a peak light emission wavelength of the green light emitting element is in a range of 520 to 541 nm, and a peak light emission wavelength of the red light emitting element or the red fluorescent member is in a range of 630 to 632 nm, and wherein an area of a light emission spectrum of the selected light emitting device in the 1931 CIE Chromaticity Diagram is adjusted.

5. A method of manufacturing a light emitting device, the method comprising:

providing a light emitting device including a blue light emitting element with a peak light emission wavelength in a range of 447 to 452 nm, a green light emitting element with a peak light emission wavelength in a range of 520 to 541 nm, and a red light emitting element or red fluorescent member with a peak light emission wavelength in a range of 630 to 632 nm;

measuring a chromaticity of the light emitting device; and sorting the light emitting device into at least one chromaticity rank each having a predetermined range of chromaticity, based on the measured chromaticity, wherein the least one chromaticity rank is a region surrounded by four defining points on a 1931 CIE Chromaticity Diagram, wherein a ratio of a distance in a y-direction between, of the four defining points, two defining points furthest from each other in the y-direction to a distance in an x-direction between, of the four defining points, two defining points furthest from each other in the x-direction is 0.5 or less, and wherein the distance in the y-direction between, of the four defining points, the two defining points furthest from each other in the y-direction on the 1931 CIE Chromaticity Diagram is in a range of 0.01 to 0.015.

6. The method according to claim 5, further comprising selecting the light emitting element for use in a color display on a liquid crystal display board when the light emitting device is sorting into the chromaticity rank that is the region surrounded by the four defining points on the 1931 CIE Chromaticity Diagram.

7. The method according to claim 5, wherein the four defining points in the region of the chromaticity rank include a first defining point, a second defining point, a third defining point, and a fourth defining point, and wherein the x and y coordinates of the first defining point are 0.255 and 0.2227, respectively, the x and y coordinates of the second defining point are 0.2607 and 0.2273, respectively, the x and y coordinates of the third defining point are 0.277 and 0.2233, respectively, and the x and y coordinates of the fourth defining point are 0.2713 and 0.2187, respectively.

8. The method according to claim 5, wherein a ratio of an optical output of the green light emitting element to an optical output of the blue light emitting element is in a range of 0.3 to 0.7.

9. A light emitting device comprising:

a blue light emitting element;

a green light emitting element; and a red light emitting element or a red fluorescent member, wherein the light emitting device has a chromaticity rank defined as a region surrounded by four defining points on a 1931 CIE Chromaticity Diagram, and a ratio of a distance in a y-direction between, of the four defining points, two defining points furthest from each other in the y-direction to a distance in an x-direction between, of the four defining points, two defining points furthest from each other in the x-direction is 0.5 or less, and wherein the distance in the y-direction between, of the four defining points, the two points furthest from each other in the y-direction on the 1931 CIE Chromaticity Diagram is in a range of 0.01 to 0.015.

10. The light emitting device according to claim 9, wherein a peak light emission wavelength of the blue light emitting element is in a range of 447 to 452 nm, a peak light emission wavelength of the green light emitting element is in a range of 520 to 541 nm, and a peak light emission wavelength of the red light emitting element or the red fluorescent member is in a range of 630 to 632 nm.

11. The light emitting device according to claim 9, wherein the distance in the y-direction between, of the four defining points, the two defining points furthest from each other in the y-direction on the 1931 CIE Chromaticity Diagram is in a range of 0.01 to 0.015.

12. The light emitting device according to claim 9, wherein the four defining points in the region of the chromaticity rank include a first defining point, a second defining point, a third defining point, and a fourth defining point, and wherein the x and y coordinates of the first defining point are 0.255 and 0.2227, respectively, the x and y coordinates of the second defining point are 0.2607 and 0.2273, respectively, the x and y coordinates of the third defining point are 0.277 and 0.2233, respectively, and the x and y coordinates of the fourth defining point are 0.2713 and 0.2187, respectively.

13. The light emitting device according to claim 9, wherein a ratio of an optical output of the green light emitting element to an optical output of the blue light emitting element is in a range of 0.3 to 0.7.

* * * * *